(12) United States Patent
Toba et al.

(10) Patent No.: US 10,095,570 B2
(45) Date of Patent: Oct. 9, 2018

(54) PROGRAMMABLE DEVICE, ERROR STORAGE SYSTEM, AND ELECTRONIC SYSTEM DEVICE

(71) Applicant: Hitachi, Ltd., Chiyoda-ku, Tokyo (JP)

(72) Inventors: Tadanobu Toba, Tokyo (JP); Kenichi Shimbo, Tokyo (JP); Yusuke Kanno, Tokyo (JP); Nobuyasu Kanekawa, Tokyo (JP); Kotaro Shimamura, Tokyo (JP); Hiromichi Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 70 days.

(21) Appl. No.: 15/110,278

(22) PCT Filed: Jan. 24, 2014

(86) PCT No.: PCT/JP2014/051443
§ 371 (c)(1),
(2) Date: Jul. 7, 2016

(87) PCT Pub. No.: WO2015/111176
PCT Pub. Date: Jul. 30, 2015

(65) Prior Publication Data
US 2016/0335145 A1 Nov. 17, 2016

(51) Int. Cl.
*G06F 11/00* (2006.01)
*G06F 11/07* (2006.01)
*H03K 19/177* (2006.01)

(52) U.S. Cl.
CPC .......... *G06F 11/079* (2013.01); *G06F 11/073* (2013.01); *G06F 11/0727* (2013.01);
(Continued)

(58) Field of Classification Search
CPC ............... G06F 11/0727; G06F 11/073; G06F 11/0751; G06F 11/0754; G06F 11/0772;
(Continued)

(56) References Cited

U.S. PATENT DOCUMENTS 4,535,455 A * 8/1985 Peterson ............... G06F 11/073
714/48
6,493,656 B1 * 12/2002 Houston ............ G06F 11/0727
702/187

(Continued)

FOREIGN PATENT DOCUMENTS

JP 1-133163 A 5/1989
JP 8-16487 A 1/1996

(Continued)

OTHER PUBLICATIONS

Translation of Japanse Patent Application JPH10-312337A, Nov. 24, 1998.*

(Continued)

*Primary Examiner* — Joshua P Lottich
(74) *Attorney, Agent, or Firm* — Crowell & Moring LLP (57) ABSTRACT

The present invention aims to provide a programmable device with a configuration memory that can hold the state of the occurrence abnormal situation that is difficult to assume such as a failure occurring in the programmable device due to the terrestrial radiation of the configuration memory, even during power off, in order to improve the reproducibility in device testing based on the held error information. The programmable device with the configuration memory includes: an error detection section for detecting an error in the configuration memory, and outputting the detected error as well as an address in which the error occurred, as error information; and an error information holding section provided with a non-volatile memory to store the output error information.

11 Claims, 8 Drawing Sheets

(52) U.S. Cl.
CPC ...... *G06F 11/0751* (2013.01); *G06F 11/0754* (2013.01); *G06F 11/0772* (2013.01); *G06F 11/0793* (2013.01); *H03K 19/1776* (2013.01); *H03K 19/17764* (2013.01)

(58) Field of Classification Search
CPC ............... G06F 11/0787; G06F 11/079; G06F 11/0793; G06F 11/1016; H03K 19/1776; H03K 19/17764
See application file for complete search history.

(56) References Cited

U.S. PATENT DOCUMENTS

| | | | |
|---|---|---|---|
| 6,772,387 B1* | 8/2004 | Plants | G01R 31/318519 714/718 |
| 7,143,329 B1* | 11/2006 | Trimberger | G01R 31/318519 326/38 |
| 7,702,978 B2* | 4/2010 | Lewis | G06F 11/1064 714/3 |
| 8,332,722 B1 | 12/2012 | Vera Rojas et al. | |
| 8,522,091 B1* | 8/2013 | White | G06F 11/008 714/725 |
| 9,274,895 B1* | 3/2016 | Wojahn | G06F 11/1446 |
| 9,665,448 B2* | 5/2017 | Nakamura | G06F 11/183 |
| 9,690,640 B2* | 6/2017 | Sade | G06F 11/073 |
| 2003/0051193 A1* | 3/2003 | Pham | G06F 11/073 714/42 |
| 2005/0071730 A1* | 3/2005 | Moyer | G06F 11/1004 714/758 |
| 2006/0010352 A1* | 1/2006 | Mukherjee | G06F 11/0724 714/47.2 |
| 2006/0271809 A1* | 11/2006 | Ichikawa | G06F 11/0727 714/2 |
| 2007/0283193 A1* | 12/2007 | Lewis | G06F 11/1064 714/48 |
| 2009/0248949 A1* | 10/2009 | Khatri | G06F 11/0712 711/6 |
| 2009/0293006 A1 | 11/2009 | Sunagawa | |
| 2012/0124442 A1* | 5/2012 | Strauss | G06F 11/0727 714/746 |
| 2012/0131382 A1* | 5/2012 | Higeta | G06F 11/0724 714/6.13 |
| 2014/0164839 A1 | 6/2014 | Toba et al. | |
| 2014/0281290 A1* | 9/2014 | Cadigan, Jr. | G06F 11/1471 711/154 |
| 2015/0089280 A1* | 3/2015 | Sade | G06F 11/073 714/6.12 |
| 2016/0266964 A1* | 9/2016 | Uekusa | G06F 11/1004 |

FOREIGN PATENT DOCUMENTS

| | | |
|---|---|---|
| JP | 10-312337 A | 11/1998 |
| JP | 2002-100979 A | 4/2002 |
| JP | 2008-134838 A | 6/2008 |
| JP | 2010-3286 A | 1/2010 |
| JP | 2013-46181 A | 3/2013 |

OTHER PUBLICATIONS

Japanese-language Office Action issued in counterpart Japanese Application No. 2015-558654 dated Jul. 25, 2017 with English translation (Eight (8) pages).

International Search Report (PCT/ISA/210) issued in PCT Application No. PCT/JP2014/051443 dated Apr. 22, 2014 with English-language translation (two (2) pages).

Japanese-language Office Action issued in counterpart Japanese Application No. 2015-558654 dated Sep. 28, 2017 with English translation (9 pages).

* cited by examiner

PROGRAMMABLE DEVICE, ERROR STORAGE SYSTEM, AND ELECTRONIC SYSTEM DEVICE

TECHNICAL FIELD

The present invention relates to a programmable device, an error storage system, and an electronic system device.

BACKGROUND ART

By way of background of the art, there is Japanese Patent Application No. 2000-285911 (Patent Literature 1). This publication describes a "configuration that includes: an FPGA; a non-volatile memory for storing the logic circuit configuration of the FPGA, as well as error status information on the details of an error that occurs within the device or in the interface with the outside; a CONFIG control unit for reading a program to configure the logic of the FPGA from the non-volatile memory; an error information access control unit for writing the error status information into the non-volatile memory; and a selection circuit for selecting the address and control signals for the non-volatile memory".

CITATION LIST

Patent Literature

Patent Literature 1: Japanese Patent Application No. 2000-285911

SUMMARY OF INVENTION

Technical Problem

With the miniaturization of semiconductor devices, the problem of soft errors due to terrestrial radiation (cosmic-ray neutrons on the ground, a rays) or other factors has been identified, in particular, in SRAM, logic gate, clock system, and the like. When a neutron with extremely high energy runs into a nucleus that forms a device, the nucleons (neutrons, protons) of the neutron collide repeatedly. At this time, a nucleon with a particularly high energy is emitted to the outside of the nucleus. When the nucleons are no longer able to have enough kinetic energy to fly out from the nucleus, the process of evaporation of light particles such as protons, neutrons, deuterons, and alpha particles from the residual nucleus in an excited state continues, and eventually the residual nucleus also has recoil energy. As a result, all such secondary particles fly at a distance according to the range within the device.

The charge is collected in a storage node by the funneling mechanism, which is that, when α rays emitted from the radioisotope contained in a semiconductor package, or the like, as well as secondary ions with the charge generated as a result of the nuclear reaction pass through the depletion layer of the storage node with SRAM at "high" state, electrons are absorbed by the node and the holes flow in the opposite direction, spreading the charge collection area along the track of the ions. When the charge is collected to the critical charge amount or more, the state changes from "high" to "low", causing a soft error.

This is the typical mechanism that has been considered as the mechanism of terrestrial radiation soft error, which is also referred to as Single Event Upset (SEU). There is a case where errors occur at the same time in a plurality of cells with respect to SEU of the memory device, which is called Multi Cell Upset (ECU) and is distinguished from Single Bit Upset (SBU: single bit error). The occurrence of MCU in the same word is called Multiple Bit Upset (MBU) which may be difficult to restore by the normal Error Correction Code (ECC).

In addition, since soft errors including SEU, unlike hard errors (fixed failure of the hardware), are a phenomenon in which it is updated to new data even after an error has occurred and is restored to normal operating condition by a restart or other action, there is a problem that it is difficult to identify the cause of the error. The impact of soft errors occurring in the logic circuit means that they lead to malfunction of the processor, ASIC, control digital circuitry, or other components of the computer, which may be a factor contributing to malfunction as the electronic system. In recent years, the programmable device has often been used as a control logic circuit of various electronic system devices in particular, among such programmable devices, the use of Field Programmable Gate Array (FPGA) has been increased.

The FPGA stores the logic circuit information in a memory (hereinafter referred to as a configuration memory) within the device to build an arithmetic circuit and a control circuit. However, the destruction of the data stored in the memory by a soft error may lead to malfunction of the electronic system device, which is getting considered to be problematic. Usually the malfunction is considered not to affect the operation as an electronic system, but is a factor leading to an increase in the power consumption, development, verification effort, cost, and the like.

The conventional technique described Patent Literature 1 is intended to record failure information occurred. In a device equipped with an FPGA for storing configuration data, which is logic circuit information, for example, such as failure information occurred in the bus between hardware units within the device, into a non-volatile memory outside the FPGA. However, with this technique, it is difficult to store terrestrial radiation failure information of the configuration memory within the FPGA that stores the logic circuit of the FPGA.

In addition, when a terrestrial radiation error occurred in the configuration memory of the programmable device, it is necessary, after detecting the error, to rewrite and reset the target programmable device, restart the system, or turn the power off and on again. When the conventional programmable device goes into this state, the error information such as the error occurrence factor, location, and time is volatilized and does not remain after restart.

However, in this method, devices used in railway, vehicle control, signal control, power transmission equipment control, and the like, need to record and store information related, to an error and to reproduce the event based on the result. Further, the availability of the information communication device is ensured mainly by duplicating the system, so it is important to take measures against failure in the switching control unit. However, because of the increasing complexity in the control with sophisticated functionality of devices, it is necessary to assume the worst event in which the system is down due to an unexpected situation. Even if the worst event occurred, it is necessary to keep what conditions under which the common cause failure occurred as the error information.

Thus, the present invention aims to hold the state of the occurrence of abnormal situation that is difficult to assume such as a failure occurring in the programmable device due to the terrestrial radiation of the configuration memory, even during power off, in order to improve the reproducibility in device testing based on the held error information.

Solution to Problem

In order to solve the above problem, for example, the configuration described in the appended claims is used.

The present application cation includes, a plurality of means for solving the above problem. As an example, there is provided a programmable device with a configuration memory, including: means for directly reading and writing the configuration memory; error detection signal output means for detecting an error in the configuration memory and outputting an error detection signal; error part identification means for inputting the error detection signal that is output from the error detection signal output means, to identify the error occurring part; a non-volatile memory; and means for storing, into the non-volatile memory, the error data occurred. In the configuration memory as well as the address that shows the location where the error occurred.

Advantageous Effects of Invention

According to the present invention, by holding the state of the occurrence of abnormal situation that is difficult to assume, such as a failure occurring in the programmable device due to the terrestrial radiation of the configuration memory, it is possible to improve the reproducibility in the device testing and to analyze the problem part, ensuring appropriate measures are in place. In particular, the data inversion error in the configuration memory may not always be found by error detection using user logic. The output of abnormal data can affect the operation of the device equipped with the programmable device. At this time, the error occurring part of the configuration memory as well as the configuration data in which the error occurred are kept, so the reproducibility of the failure can be enhanced. In this way, it is possible to provide a programmable device capable of contributing to the increased reliability and safety, and to provide an electronic system device using such a programmable device.

DESCRIPTION OF EMBODIMENTS

Preferred embodiments of a programmable device and an electronic system device using the same according to the present invention will be described with reference to the accompanying drawings.

First Embodiment

Figure 1A:
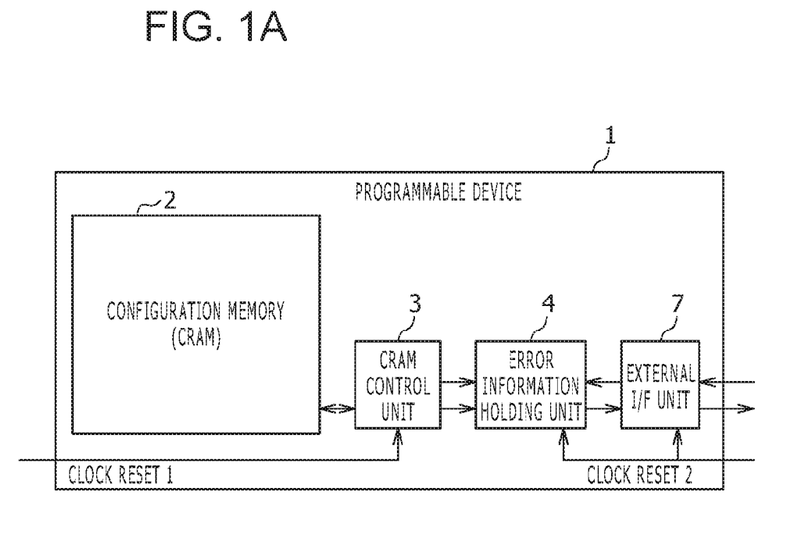
FIGS. 1A-1C are block diagrams of a programmable device according to a first embodiment of the present invention.
Figure 1B:
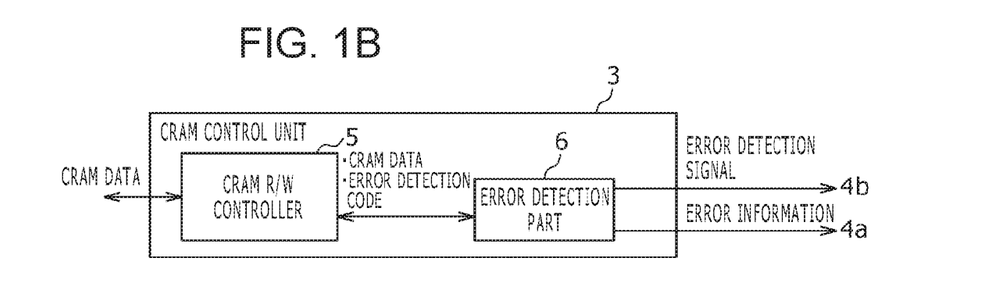
Figure 1C:
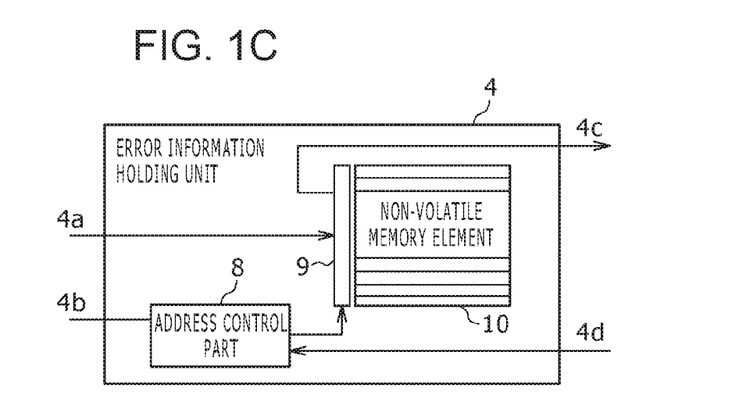

FIGS. 1(a) to (c) are block diagrams of a programmable device according to a first embodiment. FIG. 1(a) is a block diagram of a programmable device, FIG. 1(b) is a block diagram of a configuration RAM (hereinafter, CRAM) control unit, and FIG. 1c) shows an error information holding unit.

A programmable device 1 of the present embodiment includes configuration memory 2 having logic circuit data as user logic to achieve a desired function, and a configuration RAM control unit 3 for controlling the access to the data within the configuration memory 2. The CRAM control unit 3 includes a CRAM R/W controller 5 for reading and writing the data within the configuration memory 2, and an error detection part 6 for determining the presence or absence of an error in the data within the configuration memory 2.

With respect to the error detection method of the error detection part 6, for example, the error detection part 6 has a function of adding a Cyclic Redundancy Code (CRC) code for error detection into the logic circuit data within the configuration memory 2, and reading around the whole configuration memory 2 to perform error determination. After detecting the data inversion due to the terrestrial radiation of the configuration memory, the error detection part 6 outputs, as error information 4a, an error detection signal notifying that the error was detected, the address within the configuration memory in which the data is inverted, and the inverted data. The above is an example of the error information, and in addition to this, the information related to the inverted data and the information showing the error occurrence time can also be output as the error information.

With the error detection signal as a trigger, the error information is stored in an error information holding unit 4 which is non-volatile storage means. The error information holding unit 4 includes a non-volatile memory element 10, an address control part 8 for generating the address showing the storage location of the non-volatile memory element 10, and a selector 9 for electing the storage location of the non-volatile memory element 10 based. On the storage location address from the address control part 8. The address control part 8 generates and outputs the storage location address, with an error detection signal 4b as a trigger, from the CRAM control unit 3.

Note that the error information holding unit 4 of the present embodiment is configured to store a plurality of pieces of error information, but it can also be configured to store only one piece of error information. In such a case, it is enough to have only one area for storing the error information and there is no need to sort the address that shows the location of the area. Thus, the configuration of the error information holding unit 4 does not require the address control part 8 and the selector 9 as the components. The error information stored in the error information holding unit 4 is read to the outside of the programmable device 1 through an external I/F control unit 7.

In the present embodiment, the error information holding unit 4 is configured to output the stored error information (4c) after receiving a read request 4d from the outside. Note that it can also be configured that the address of the non-volatile memory element 10 is directly input as the read request 4d. In this case, the storage location address generation by the address control part 8 may not be necessary.

As described above, according to the present invention, it is possible to store the data inversion information within the configuration memory of the programmable device, which is used in an electronic system product, into the non-volatile memory. Thus, it is possible to read the error information of the configuration memory even after power off, and to improve the reproducibility in device testing. As a result, it is possible to analyze the problem part and to ensure appropriate measures are in place.

Note that an Electrically Erasable Programmable Read-Only Memory (EEPROM) or a flash memory is used for the non-volatile memory.

Second Embodiment

Figure 2:
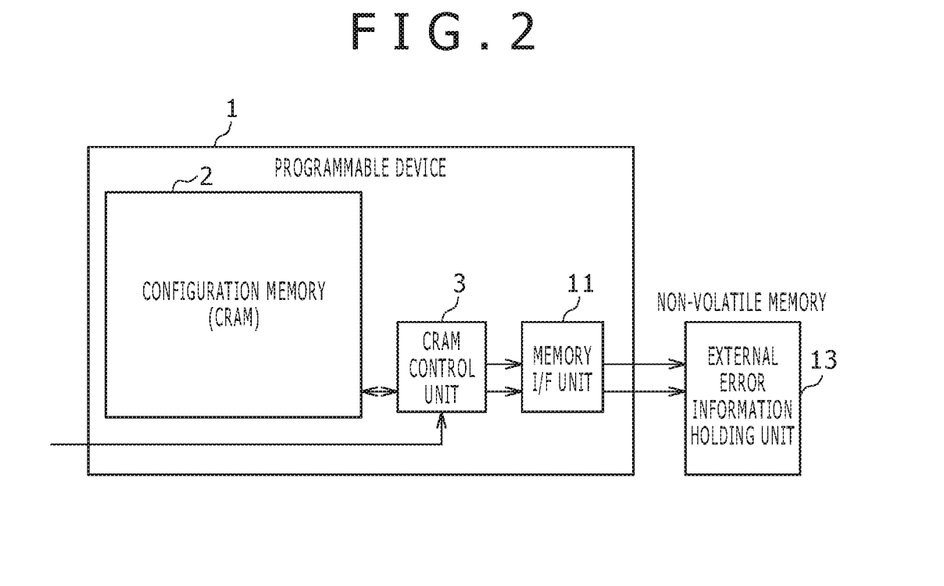
FIG. 2 is a block diagram of a programmable device according to a second embodiment of the present invention.

FIG. 2 is a programmable device according to a second embodiment. Like parts are denoted by the same reference numerals as in FIG. 1, whose configurations and operations are the same, and thus the description thereof will be omitted.

In the configuration shown in FIG. 2, the data inversion, which is due to the terrestrial radiation of the configuration memory 2 or other factors, is detected by the CRAM control unit 3. Then, the error detection signal and the error information are output to a memory I/F unit 11. The memory I/F unit 11 outputs the error information data as well as the address that shows the location where the error information data is stored, to an external error information holding unit 13 which is formed of a non-volatile memory outside the particular programmable device 1. Note that the external error information holding unit 13 may also be utilized for the non-volatile memory in which the logic circuit information of the programmable device 1 is stored. In this way, there is no need to provide an additional non-volatile memory, so that it is effective in reducing the cost and power consumption and reducing the board size through a reduction in the number of parts.

As described above, according to the present invention, it is possible to hold the data inversion information within the configuration memory, without the need to provide the non-volatile memory in the programmable device, and thus a cost reduction can be achieved.

Third Embodiment

Figure 3A:
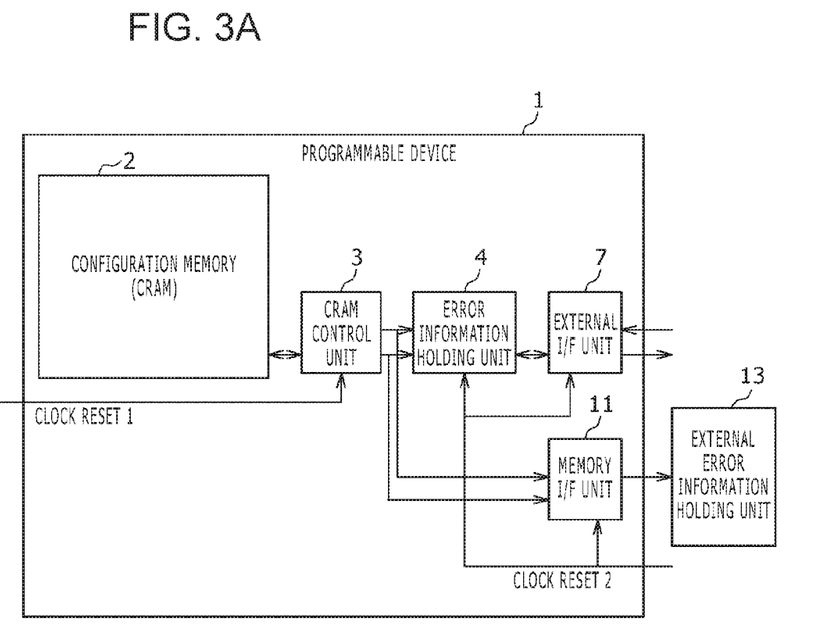
FIGS. 3A and 3B are block diagrams of a programmable device according to a third embodiment of the present invention.
Figure 3B:
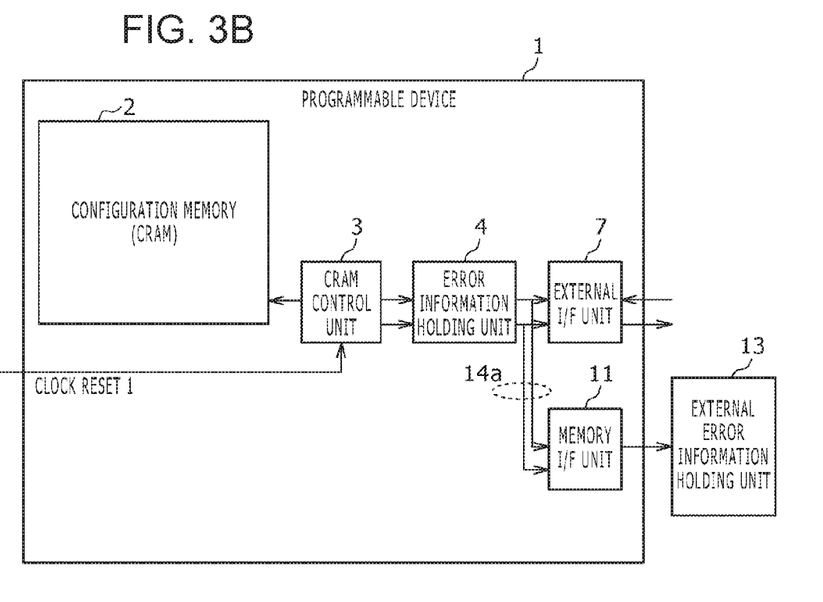

FIGS. 3(a) and (b) are diagrams of a programmable device according to a third embodiment. FIG. 3(a) is a block diagram of a programmable device, and FIG. 3(b) is a block diagram of the programmable device in which the error information is stored within the device. Like parts are denoted by the same reference numerals as in FIGS. 1(a) to 2, whose configurations and operations are the same, and thus the description thereof will be omitted.

In the present embodiment, the error detection signal and error information output from the CRAM control unit 3 are stored both in the error information holding unit 4 located within the programmable device 1 shown in FIG. 3(a), as well as in the external error information holding unit 13 formed of the non-volatile memory on the outside. The storage procedure to the respective information holding units is the same as the storage procedure in the first and second embodiments. With this configuration, it is possible to make the storage unit of the error information being redundant. In this way, if a failure occurred in the programmable device 1, it is possible to read the error information from the external error information holding unit 13, and to increase the reliability.

Shown in FIG. 3(b) is an example of the configuration in which the error detection signal and error information output from the CRAM control unit 3 are once stored in the error information holding unit 4, and then are stored in the external error information holding unit 13 through the memory I/F unit 11. In this configuration, it is possible to once record a large amount of error information at a high speed into the error information holding unit 4 within the programmable device, and then transfer to the external error information holding unit 13 at a slow transfer speed. In general, the data transfer speed to the outside of the device is often slow due to electrical limitations and, in order to avoid missing error information, the error information is stored at a high speed into the so-called cache, which is the temporal storage means used for the processor or the like within the device.

According to this configuration, for example, by storing not only the bit data of the data being inverted but also the data around the bit in which the error occurrence was detected into the non-volatile memory, it is possible to store a plurality of bit data inversion phenomena that occur due to a particle of terrestrial radiation, enabling a detailed analysis of the cause of the failure.

Figure 4:
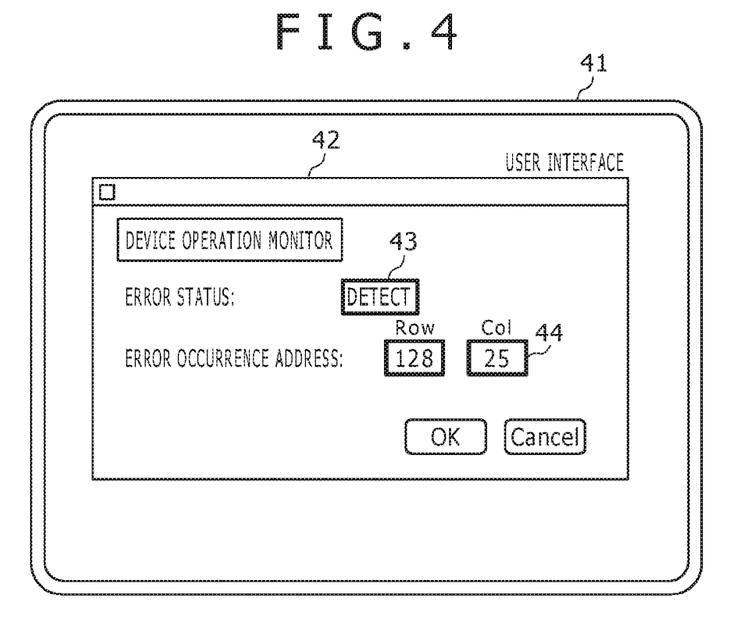
FIG. 4 is an example of the control setup screen of the programmable device according to the first embodiment of the present invention, as well as the screen for outputting the error detection result.

FIG. 4 is an example of the operation monitoring result screen in the electronic system device equipped with one of the programmable devices according to the first to third embodiments. An operation monitor window 42 is displayed on a display screen 41. The results of monitoring the operation of the device are displayed. In the operation monitor window 42.

The content of the operation monitor includes a window 43 (next to the error status in the figure) showing an error detection from the programmable device, as well as a window 44 (next to the error occurrence address in the figure) showing the physical address in which the error occurred.

Fourth Embodiment

Figure 5:
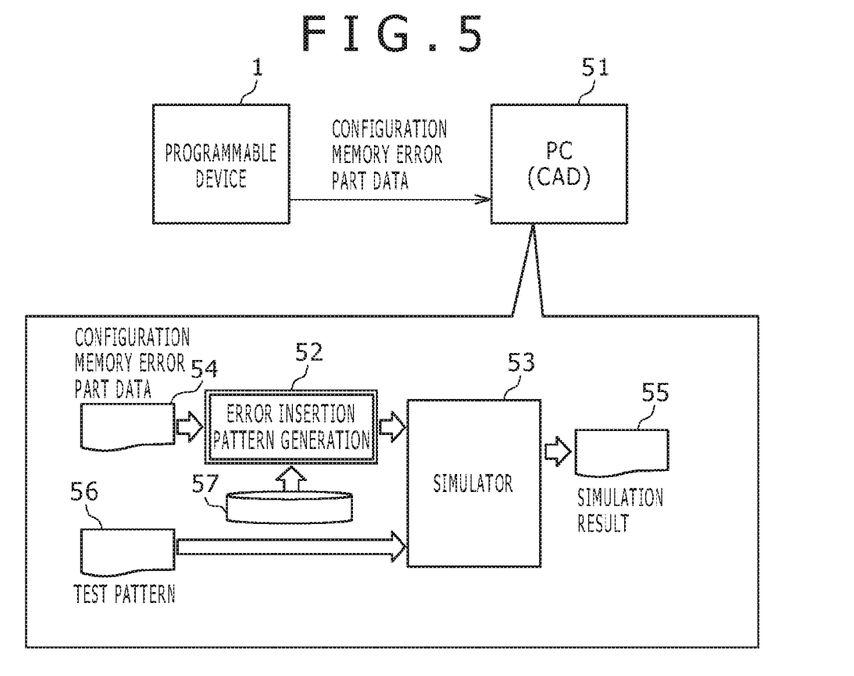
FIG. 5 is a block diagram of a programmable device according to a fourth embodiment of the present invention.

FIG. 5 is a conceptual diagram of a fourth embodiment the present embodiment, the description will focus on a method for designing a logic circuit having a function that the user of the programmable device 1 desires, by using a PC 51. The PC 51 of this embodiment includes: a simulator 53 for performing a functional simulation of the logic circuit to achieve the function that the user desires; an error insertion pattern generation unit 52; and an address map data 57 for storing the correspondence data between the address of the configuration memory and the logic circuit.

The error insertion pattern generation unit 52 rewrites the logic circuit information in which the error occurred, from configuration memory error part data 54, which is the information related to the data inversion error within the configuration memory received from the programmable device 1 with one of the configurations according to the first to third embodiments, and from the address map data 57. The simulator 53 performs a functional simulation by a test pattern 56 for performing the functional simulation, and reproduces the operation failure. Then, the simulator 53 outputs a simulation result 55 that shows the failure part.

As described above, it is possible to reproduce the failure of the programmable device due to terrestrial radiation and to check the solutions on the computer, ensuring appropriate measures are in place.

Fifth Embodiment

Figure 6A:
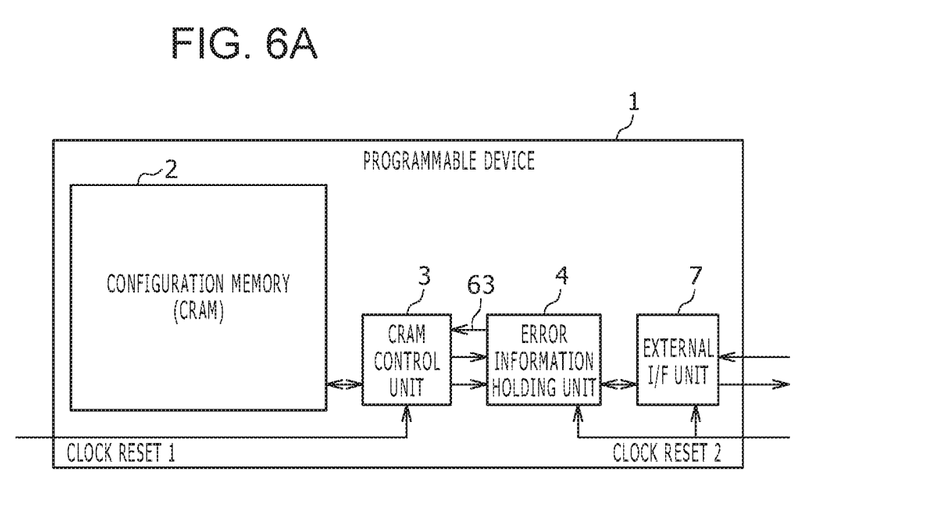
FIGS. 6A and 6B are block diagrams of a programmable device according to a fifth embodiment of the present invention.
Figure 6B:
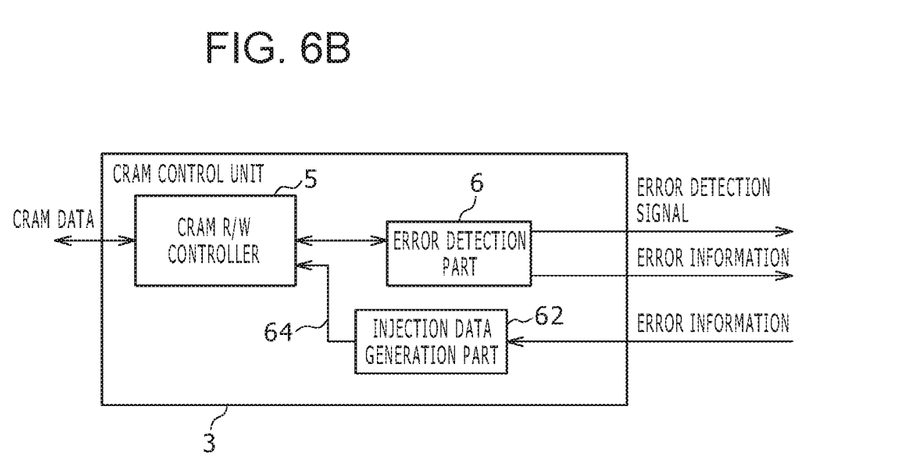

FIGS. 6(a) and (b) are diagrams showing a programmable device according to a fifth embodiment. FIG. 6(a) is a block diagram of a programmable device, and FIG. 6(b) is a block diagram of a CRAM control unit within the programmable device of FIG. 6(a). Like parts are denoted by the same reference numerals as in FIG. 1, whose configurations and operations are the same, and thus the description thereof will be omitted.

In the present embodiment, as shown in FIG. 6(b), an injection data generation part 62 is provided within the CRAM control unit 3 in the configuration shown in FIG. 1. Further, there is also provided means 64 for outputting the address into which the error is inserted by the injection data generation part 52. In the configuration of FIG. 6, an error insertion instruction is received from the outside of the programmable device 1 through the external I/F unit. Then, in response to this instruction, the address of the location where the error occurred, which is error information 63 stored in the error information holding unit 4, is output to the injection data generation part 62. The injection data generation part 62 generates an error insertion location and error information, and inserts the generated result as a write error into the configuration memory 2 through the CRAM R/W controller 5. By this error insertion, it is possible to reproduce the error operation of the programmable device 1.

As described above, the failure of the programmable device due to terrestrial radiation can be reproduced on the actual device, so that it is possible to check the solutions on the actual device and to ensure appropriate measures are in place.

Sixth Embodiment

Figure 7:
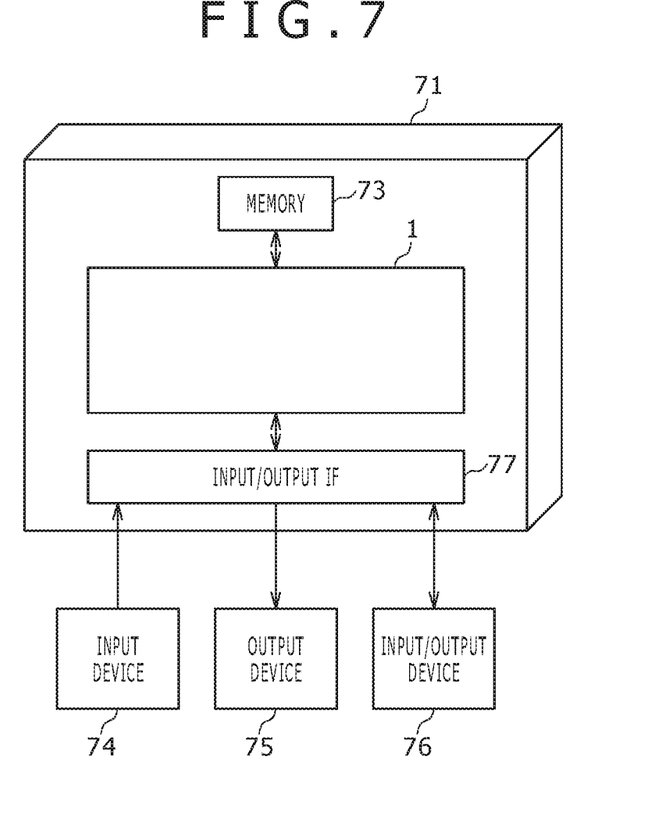
FIG. 7 is a block diagram of a control device according to a sixth embodiment of the present invention.

FIG. 7 shows a configuration example of a control system device equipped with the programmable device 1 with one of the configurations according to the first to third embodiments.

A control system device 71 is equipped with the programmable device with the configuration of the first, second, or third embodiment. The control system device 71 includes the programmable device 1, an execution memory 73 used in the device, and an input/output IF unit 77 with external devices. Further, an input device 74 such as a camera, an output device 75 such as a monitor, and an input/output device 76 for giving and receiving control information to and from the device to be controlled, such as a motor, are also provided through the input/output IF unit 77. In the case of the motor, which is an example of the input/output device, the input/output device determines the rotational speed by a control value from the control system device side, to perform a rotation operation. At the same time, the input/output device monitors the rotation and feeds back to the system side to perform a control such as maintaining a constant rotation.

Here, when the programmable device 1 is used for the rotation control, the control value can rapidly change due to the data inversion error occurred within the configuration memory 2, leading to unexpected situations such as an abnormal rotational speed and a stopped state. Conventionally, the abnormal state is controlled by the operation state monitoring mechanism within the programmable device or within the device, in such a way that it monitors the abnormal state, and when detecting an abnormal state, turns the power off so that the abnormal operation does not affect the outside of the device.

In the programmable device 1 according to the present embodiment, the data inversion information within the configuration memory is stored in the error information holding unit 4, which is the non-volatile memory, or in the external error information holding unit 13. In this upon resumption after power off, it is possible to find that the data inversion of the configuration memory is the cause of the failure.

Further, the data inversion due to terrestrial radiation can be restored by rewriting the data within the configuration memory by turning the power on again. Thus, if it is found that the cause of the failure is the data inversion of the configuration memory, then it is possible to resume operation without the need of maintenance work such as exchange of boards and parts.

Figure 8:
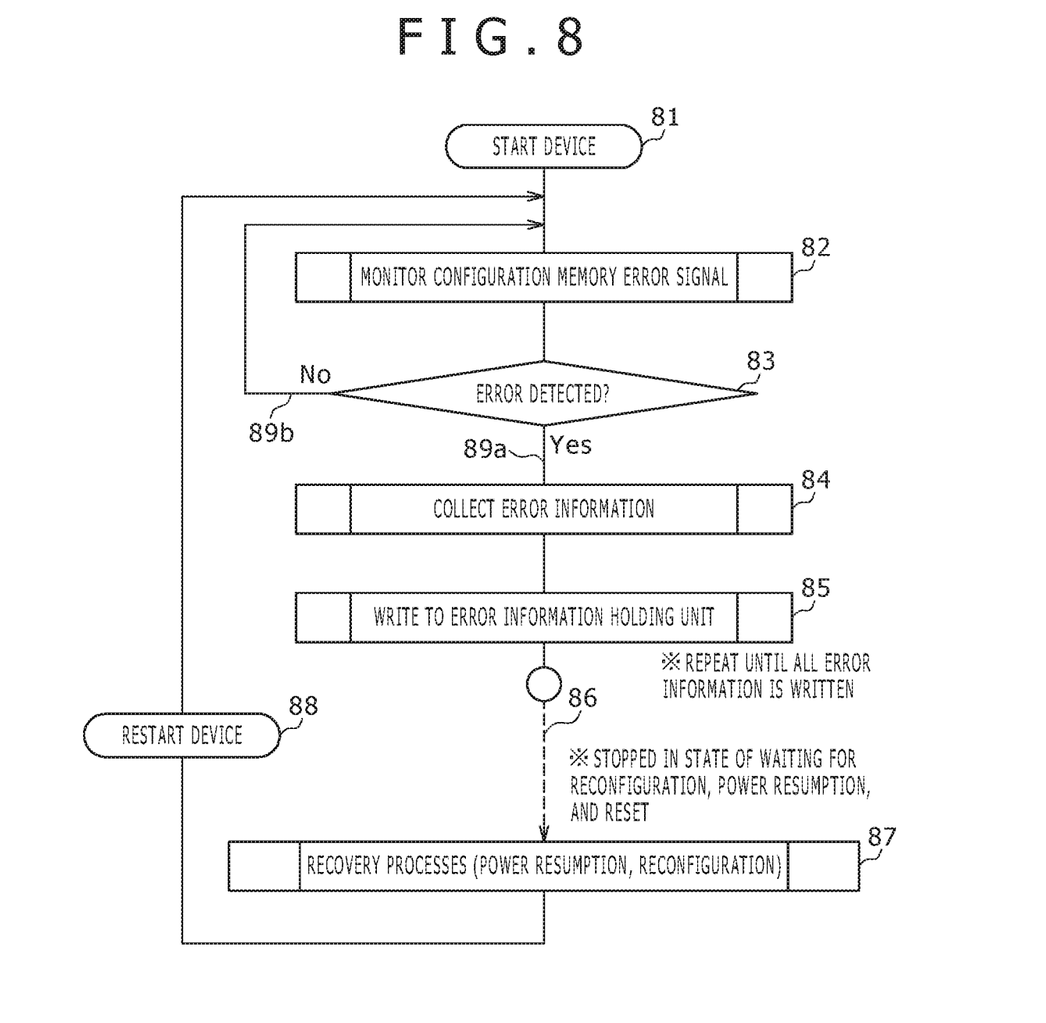
FIG. 8 shows a process flow in which the error information is held in the control device according to the sixth embodiment of the present invention.

FIG. 8 shows a process flow for storing the error information in the electronic system device equipped with the programmable device with one of the configurations according to the first, second, and third embodiments. The same process is performed in the configuration of the control system device shown in FIG. 7 which is an example of the electronic system device.

After the device is started (81), the CRAM control unit 3 of the programmable device 1 mounted on the device monitors the data inversion due to the terrestrial radiation of the configuration memory 2 or other factors (82). The CRAM control unit 3 detects an error due to data inversion (83). When an error is detected (89a), the CRAM control unit 3 collects the error occurrence part as well as the data within the configuration memory in which the error occurred. (84), and writes the error information in the error information holding unit 4 or in the external error information holding unit 13 (85). Then, the CRAM control unit 3 puts the device into a stopped state until the programmable device is reconfigured and the power is turned on again (86). Error information writing is repeated until the error information related to all the errors detected in the error detection (83) is written.

The recovery from the data inversion of the configuration memory 2 is done by performing the device recovery process (87) such as power resumption, reconfiguration process, and reset setup are performed. Here, the device is restarted (88) to perform the device-specific recovery processes involved in the error information collection process and the determination of whether the failure was a temporary error due to the data inversion of the configuration memory. Then, the device is put into a steady operation state.

Figure 9A:
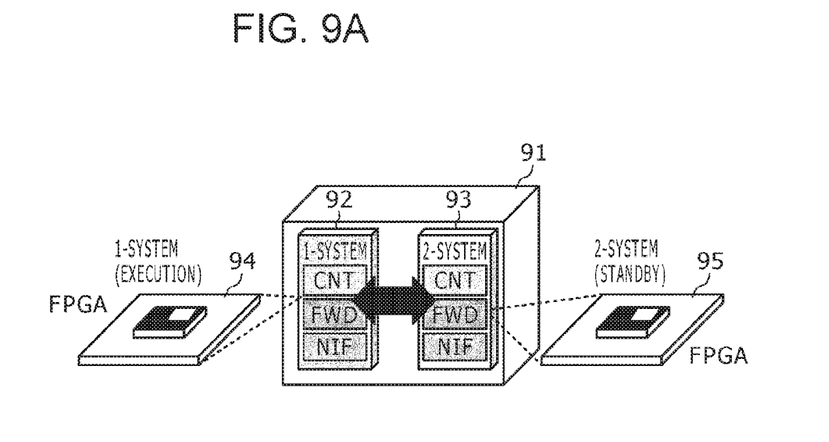
FIGS. 9A and 9B show a recovery process based on the dual system of the communication device according to the sixth embodiment of the present invention.
Figure 9B:
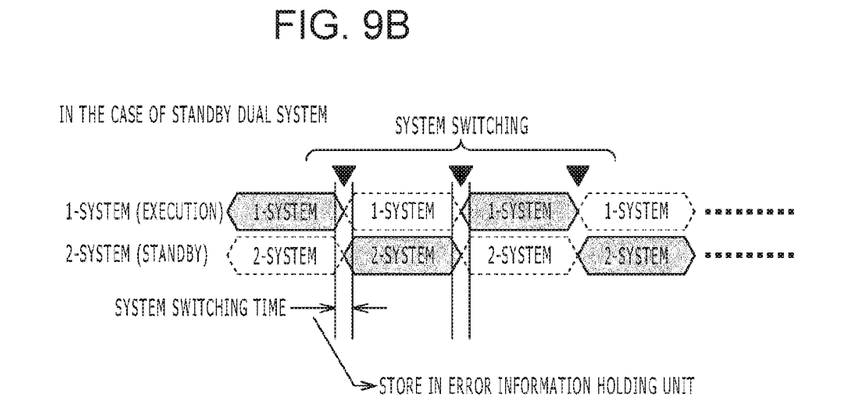

FIGS. 9(a) and (b) show the electronic system device according to the present embodiment, as well as an example of the method of controlling the recovery process by a dual system of the device at the occurrence of an error. The present embodiment will be described in connection with a communication device 91 as an example of the electronic system device.

The communication device 91 includes a communication device of an execution system 92 called 1-system, and a communication device of a system 93 called 2-system.

Further, FIG. 9(a) shows an example in which FPGA is used as programmable devices 94 and 95. The communication device 91 includes: a communication control unit for inputting communication packet data and selecting the output destination according to the destination data added to the packet data; a diagnosis unit for diagnosing whether the communication control unit is normally operated; and a control unit for controlling the unit operations, such as operation start of the communication control unit and the diagnosis unit, reset, and initialization of the equipped processor and programmable device. The programmable device is mounted on all the units described above.

For example, in the communication device 91, when the 1-system (execution system) 92 is stopped due to a certain event, as shown. In FIG. 9(*b*), the communication device 91 switches the system from the 1-system (execution system) 92 to the 2-system (standby system) 93 within the time range that does not affect the user using the device. During the time when the service is continued by the 2-system, the recovery process involved in power resumption, reconfiguration, and reset process are performed on the 1-system. After a check of the data of the error information holding unit 4 of the programmable device 1 according to the present embodiment, the error information of the configuration memory 2 is read to compare and confirm that the data after reconfiguration is normal. Then, at the time of finding that there is no problem, the 1-system can return to the standby state.

As described above, according to the present invention, by holding the state of the occurrence of an abnormal state that is difficult to assume, such as a failure that occurs in the programmable device due to the terrestrial radiation of the configuration memory, it is possible to improve the reproducibility in device testing and to analyze the problem part, ensuring appropriate measures are in place. In this way, it is possible to provide a programmable device capable of contributing to increased reliability and safety, and to provide an electronic system device using such a programmable device.

Note that the present invention is not limited to the exemplary embodiments described above and includes various modifications. For example, the exemplary embodiments have been described in detail to better illustrate the present invention, and are not necessarily limited to those having all the configurations described in the exemplary embodiments. Further, a part of the configuration of an embodiment can be replaced by the configuration of another embodiment. Also, the configuration of another embodiment can be added to the configuration of an embodiment. Furthermore, the addition, deletion, and replacement of another configuration can be made to a part of the configuration of each embodiment.

As variations, the following configurations can be considered.

As a first variation, there is provided a programmable device with a configuration memory, including: means for directly reading and writing the configuration memory; error detection signal output means for detecting an error in the configuration memory and outputting an error detection signal; error part identification means for inputting the error detection signal output from the error detection signal output means, to identify the error occurrence part; a non-volatile memory; and means for storing, into the non-volatile memory, the data of the error occurred in the configuration memory as well as the address that shows the location where the error occurred.

As a second variation, there is provided a programmable device with a configuration memory, including: means for directly reading and writing the configuration memory; error detection signal output means for detecting an error in the configuration memory and outputting an error detection signal; error part identification means for inputting the error detection signal that is output from the error detection signal output means, to identify the error occurrence part; and means for outputting the data of the error occurred in the configuration memory, as well as the address that shows the location where the error occurred, from the programmable device to store into a non-volatile memory.

As a third variation, there is provided, a programmable device with a configuration memory, including: means for directly reading and writing the configuration memory; error detection signal output means for detecting an error in the configuration memory and outputting an error detection signal; error part identification means for inputting the error detection signal that is output from the error detection single output means, to identify the error occurrence part; a non-volatile memory; means for storing, into the non-volatile memory, the data of the error occurred in the configuration memory as well as the address that shows the location where the error occurred; and means for outputting the address that shows the location where the error occurred, from the programmable device to store into the non-volatile memory.

As a fourth variation, there is provided a programmable device described in any one of the first to third variations, including: data storage means for associating the storage part in the configuration memory with the logical information to be written in the programmable device; means for rewriting some of the logical information based on the data within the data storage means, and based on the error information detected. In the configuration memory; input data storage means for checking the rewritten logical information as well as the function of the logical information; and means for simulating the functional operation based on the logical information and the input data.

As a fifth variation, there is provided a verification method of a programmable device and a verification method of an electronic system device equipped with the programmable device. The programmable device, which is described in any one of the first to third variations, includes means for reading the error information stored in the non-volatile memory and rewriting the data of the configuration memory.

As a sixth variation, there is provided an electronic system device on which a programmable device with a configuration memory is mounted. The electronic system includes: means for directly reading and wilting the configuration memory; error detection signal output means for detecting an error in the configuration memory and outputting an error detection signal; error part identification means for inputting the error detection signal output from the error detection signal output means, to identify the error occurrence part; a non-volatile memory; and means for storing, into the non-volatile memory, the data of the error occurred in the configuration memory as well as the address that shows the location where the error occurred.

Further, some or all of the configurations, functions, process parts, process means and the like described above can be achieved by hardware in such a way that they are designed, for example, with an integrated circuit, or other methods. Also, each of the configurations, functions, and the like described above may be achieved by software in such a way that the processor interprets and executes the program that achieves each function. The information such as program, table, and file for achieving each function can be placed in storage devices such as a memory, hard disk, SSD (Solid State Drive), or in the storage media such as an IC card, SD card, and DVD.

In addition, the control and information lines that are considered to be necessary for the explanation are shown here, so all the control and information lines are not necessarily shown in terms of the product. In practice, almost all of the configurations can be considered to be mutually interconnected.

REFERENCE SIGNS LIST

1: programmable device
2: configuration memory
3: CRAM control unit
4: error information holding unit
4a, 4b, 4c, 4d: error information, error detection signal, read error information, read request
5: CRAM R/W controller
6: error detection part, 7: external I/F control unit
8: address control part
9: selector
10: non-volatile memory element
11: memory I/F unit
13: external error information holding unit
14: diagram of inside of programmable device, 14a: error information
41: display screen
42: operation monitor window
43: window showing error detection
44: window showing error part address
51: PC for performing simulation
52: error insertion pattern generation unit
53: simulator
54: configuration memory error part data
55: simulation result
56: test pattern
62: injection data generation part
63: error information (error information stored in error information holding unit)
64: error insertion address and error data to be inserted
71: control system device
73: execution memory
74: input device, 75: output device
76: input/output device.
77: input/output IF
91: communication device
92: communication device 1-system (normal operating system)
93: communication device 2-system (standby system)
94: example of programmable device mounted on communication device 1-system
95: example of programmable device mounted on communication device 2-system

The invention claimed is:

1. A programmable device with a configuration memory, comprising:
   an error detection section for detecting an error in the configuration memory, and outputting the detected error as well as the address in which the error occurred, as error information; and
   an error information holding section provided with a non-volatile memory to store the output error information,
   wherein the error detection section outputs an error detection signal notifying that the error was detected, to the error information holding section,
   wherein the error information holding section includes an address control part for generating an address that shows a location for storing the error information into the non-volatile memory, and
   wherein, when the error detection signal is input to the error information holding section, the address control part generates the address that shows the location for storing the error information into the non-volatile memory, and in this way the error information is stored in the generated address.

2. The programmable device according to claim 1, comprising an error insertion pattern generation section for inserting the error into the configuration memory based on the error information.

3. An electronic system device comprising:
   the programmable device according to claim 2; and
   an input/output IF section for inputting and outputting data to and from external devices.

4. An electronic system device comprising:
   the programmable device according to claim 1; and
   an input/output IF section for inputting and outputting data to and from external devices.

5. The electronic system according to claim 4,
   wherein the programmable device includes:
      detecting an error of the configuration memory by the error detection section;
      storing the detected error as well as the address in which the error occurred, as error information, into the non-volatile memory of the error information holding section; and
      performing a recovery process of the electronic system device based on the error information.

6. A programmable device with a configuration memory, comprising:
   an error detection section for detecting an error in the configuration memory, and outputting the detected error as well as the address in which the error occurred, as error information;
   an internal error information holding section provided with a non-volatile memory to store the output error information, and
   an external output means for outputting the error information stored in the non-volatile memory of the internal error information holding section to outside of the programmable device.

7. The programmable device according to claim 6, comprising an error insertion pattern generation section for inserting the error into the configuration memory based on the error information.

8. An electronic system device comprising:
   the programmable device according to claim 7; and
   an input/output IF section for inputting and outputting data to and from external devices.

9. An error information storage system comprising:
   the programmable device according to claim 6; and
   an external error information holding section provided with a non-volatile memory to store the error information output from the external output means.

10. An electronic system device comprising:
    the programmable device according to claim 6;
    an external error information holding section provided with a non-volatile memory to store the error information output from the external output means; and
    an input/output IF section for inputting and outputting data to and from external devices.

11. The electronic system device according to claim 10,
    wherein the programmable device includes:
       detecting an error of the configuration memory by the error detection section;
       storing the detected error as well as the address in which the error occurred, as error information, into the non-volatile memory of the external error information holding section; and performing a recovery process of the electronic system device based on the error information.

\* \* \* \* \*